United States Patent
Castro

(10) Patent No.: US 10,083,752 B2
(45) Date of Patent: *Sep. 25, 2018

(54) APPARATUSES AND METHODS FOR EFFICIENT WRITE IN A CROSS-POINT ARRAY

(71) Applicant: OVONYX MEMORY TECHNOLOGY, LLC, Alexandria, VA (US)

(72) Inventor: Hernan Castro, Shingle Springs, CA (US)

(73) Assignee: OVONYX MEMORY TECHNOLOGY, LLC, Alexandria, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/690,044

(22) Filed: Aug. 29, 2017

(65) Prior Publication Data

US 2017/0358353 A1    Dec. 14, 2017

Related U.S. Application Data

(63) Continuation of application No. 15/237,363, filed on Aug. 15, 2016, now Pat. No. 9,779,811, which is a (Continued)

(51) Int. Cl.
   *G11C 11/00*  (2006.01)
   *G11C 13/00*  (2006.01)

(52) U.S. Cl.
   CPC ........ *G11C 13/0069* (2013.01); *G11C 13/004* (2013.01); *G11C 13/0004* (2013.01);
   (Continued)

(58) Field of Classification Search
   CPC . G11C 11/4091; G11C 11/15; G11C 13/0004; G11C 13/0007; G11C 13/0011;
   (Continued)

(56) References Cited

U.S. PATENT DOCUMENTS

| 6,385,075 | B1 | 5/2002 | Taussig et al. |
| 6,768,685 | B1 | 7/2004 | Scheuerlein |

(Continued)

FOREIGN PATENT DOCUMENTS

| WO | WO 2009158673 A1 | 12/2009 |
| WO | WO 2015038328 A1 | 3/2015 |

OTHER PUBLICATIONS

Ielmini et al., "Recovery and Drift Dynamics of Resistance and Threshold Voltages in Phase-Change Memories", IEEE Transactions on Electron Devices, Feb. 2007, pp. 308-315, vol. 54, Issue 2, IEEE.

(Continued)

*Primary Examiner* — Thong Q Le
(74) *Attorney, Agent, or Firm* — Holland & Hart LLP

(57) ABSTRACT

A memory circuit, including a memory array (such as a cross-point array), may include circuit elements that may function both as selection elements/drivers and de-selection elements/drivers. A selection/de-selection driver may be used to provide both a selection function as well as an operation function. The operation function may include providing sufficient currents and voltages for WRITE and/or READ operations in the memory array. When the de-selection path is used for providing the operation function, highly efficient cross-point implementations can be achieved. The operation function may be accomplished by circuit manipulation of a de-selection supply and/or de-selection elements.

20 Claims, 10 Drawing Sheets

Related U.S. Application Data continuation of application No. 14/591,800, filed on Jan. 7, 2015, now Pat. No. 9,418,738, which is a continuation of application No. 13/914,170, filed on Jun. 10, 2013, now Pat. No. 8,953,387.

(52) U.S. Cl.
CPC ...... *G11C 13/0007* (2013.01); *G11C 13/0026* (2013.01); *G11C 13/0028* (2013.01); *G11C 13/0097* (2013.01); *G11C 2013/0092* (2013.01); *G11C 2213/77* (2013.01)

(58) Field of Classification Search
CPC ... G11C 13/004; G11C 2207/065; G11C 7/06; G11C 11/26; G11C 11/406; G11C 11/5607; G11C 11/5628
USPC .......... 365/158, 203, 171, 173, 148, 189.15, 365/207, 226, 230.03, 63, 163, 185.18, 365/189.09, 189.16
See application file for complete search history.

(56) References Cited

U.S. PATENT DOCUMENTS

| | | | |
|---|---|---|---|
| 7,085,190 B2 | 8/2006 | Worley et al. | |
| 7,139,192 B1 | 11/2006 | Wong | |
| 7,414,883 B2 | 8/2008 | Gordon et al. | |
| 7,483,296 B2 | 1/2009 | Bedeschi et al. | |
| 7,502,252 B2 | 3/2009 | Fuji et al. | |
| 7,672,155 B2 | 3/2010 | Kim et al. | |
| 7,859,896 B2 | 12/2010 | Kurotsuchi et al. | |
| 8,194,433 B2 | 6/2012 | Parkinson | |
| 8,208,285 B2 | 6/2012 | Khoury et al. | |
| 8,243,505 B2 | 8/2012 | Kang et al. | |
| 8,374,022 B2 | 2/2013 | Langtry et al. | |
| 8,400,815 B2 | 3/2013 | Terada et al. | |
| 8,467,253 B2 | 6/2013 | Perner | |
| 8,576,609 B2 | 11/2013 | Scheuerlein | |
| 8,605,495 B2 | 12/2013 | Lung | |
| 8,673,733 B2 | 3/2014 | Sadaka et al. | |
| 8,681,540 B2 | 3/2014 | Zeng | |
| 8,716,780 B2 | 5/2014 | Kellam et al. | |
| 8,817,533 B2 | 8/2014 | Gopalakrishnan | |
| 8,953,363 B2 | 2/2015 | Shimakawa et al. | |
| 8,953,387 B2 | 2/2015 | Castro | |
| 9,117,515 B2 | 8/2015 | Lee et al. | |
| 9,312,005 B2 | 4/2016 | Castro | |
| 9,324,423 B2 | 4/2016 | Castro | |
| 9,306,549 B2 | 5/2016 | Chevallier et al. | |
| 9,779,811 B2 * | 10/2017 | Castro | G11C 13/0004 |
| 2010/0284213 A1 | 11/2010 | Savransky | |
| 2012/0002461 A1 | 1/2012 | Karpov et al. | |

OTHER PUBLICATIONS

ISA/KR, International Search Report and Written Opinion of the International Searching Authority, Int'l Appl. No. PCT/US2014/052763, dated Dec. 3, 2014, Korean Intellectual Property Office, Republic of Korea, 12 pages.

ISA/KR, International Search Report and Written Opinion of the International Searching Authority, Int'l Appl. No. PCT/US2015/029106, dated Aug. 6, 2015, Korean Intellectual Property Office, Republic of Korea, 10 pages.

Kostylev, "Recovery and other effects of annihilation of high current density filaments after switching in chalcogenide alloys", Non-Volatile Memory Technology symposium, Nov. 11-14, 2008, pp. 1-7, IEEE.

* cited by examiner

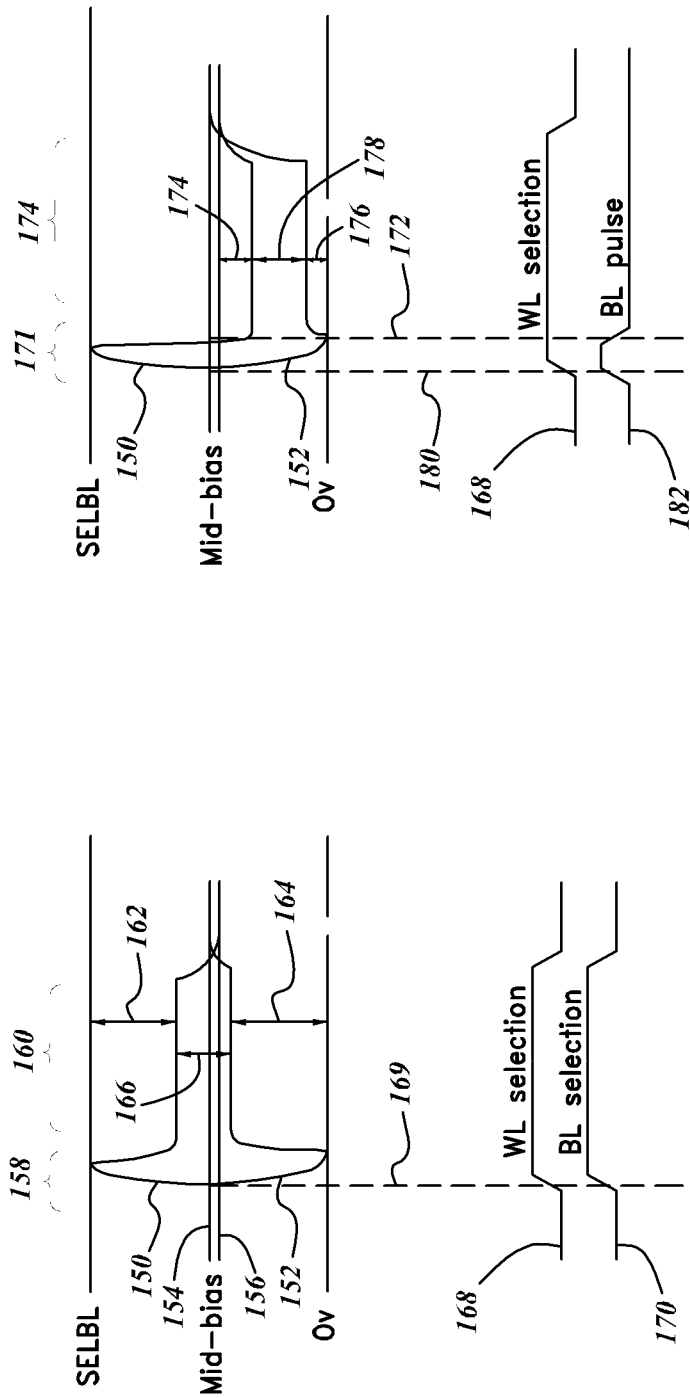

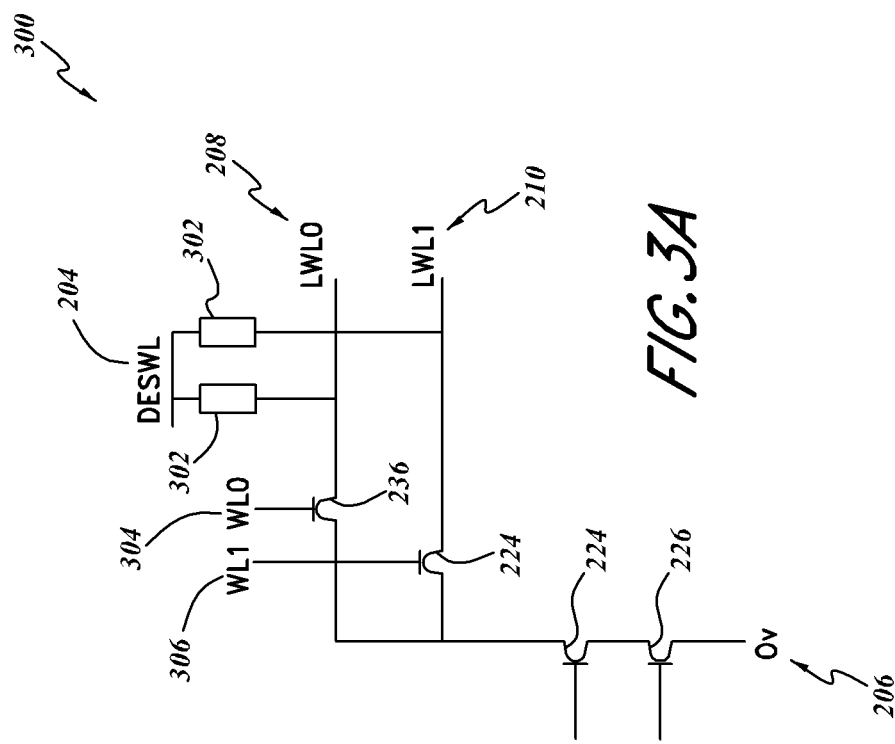
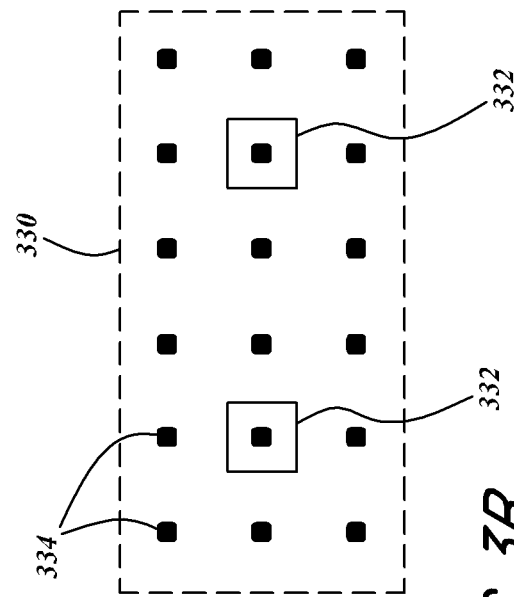
FIG.3A
FIG.3B

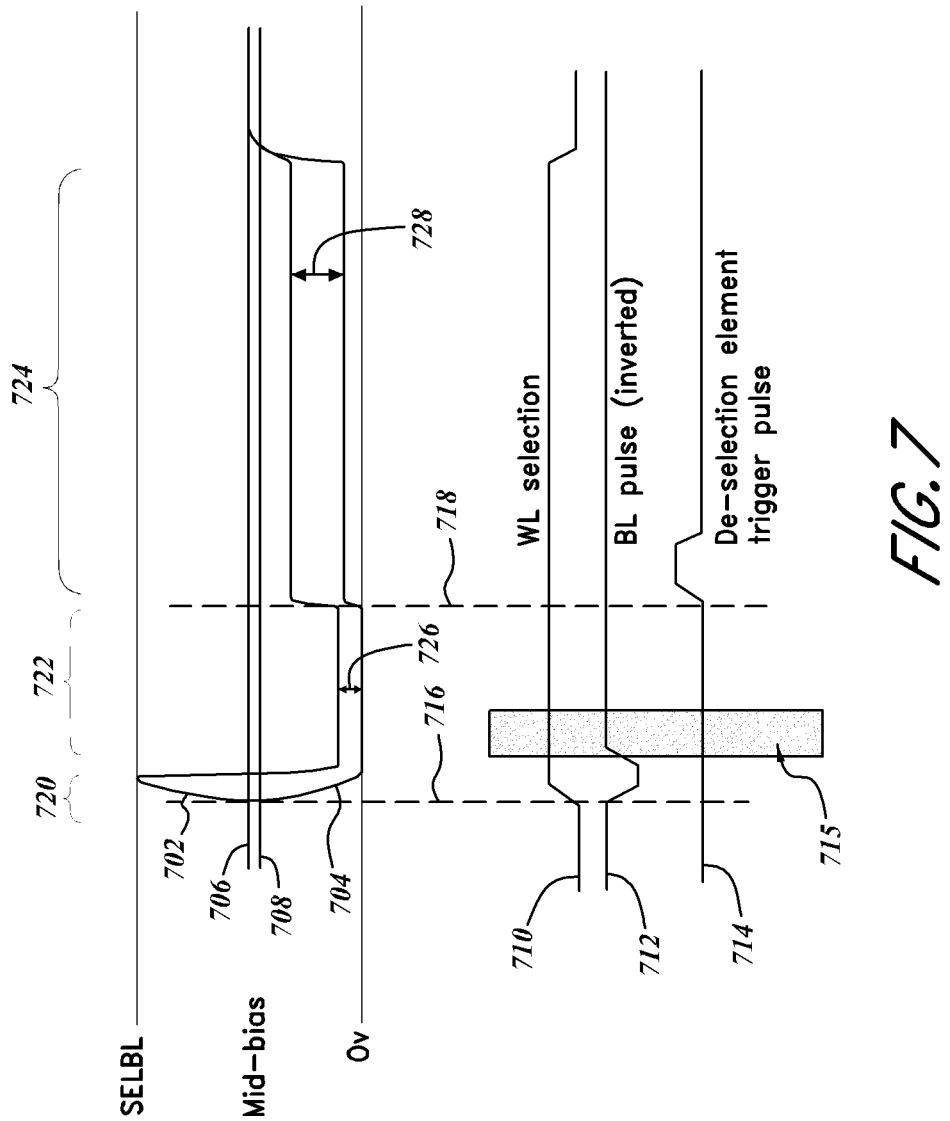

APPARATUSES AND METHODS FOR EFFICIENT WRITE IN A CROSS-POINT ARRAY

CROSS REFERENCES

The present Application for Patent is a continuation of U.S. patent application Ser. No. 15/237,363 by Castro, entitled "Apparatuses and Methods for Efficient Write in a Cross-Point Array," filed Aug. 15, 2016, which is a continuation of U.S. patent application Ser. No. 14/591,800 by Castro, entitled "Apparatuses and Methods for Efficient Write in a Cross-Point Array," filed Jan. 7, 2015, which is a continuation of U.S. patent application Ser. No. 13/914,170 by Castro, entitled "Apparatuses and Methods for Efficient Write in a Cross-Point Array," filed Jun. 10, 2013, assigned to the assignee hereof, and each of which is expressly incorporated by reference in its entirety herein.

BACKGROUND

Field of the Invention

Embodiments of the present disclosure generally relate to electronics, and in particular, to memory circuits.

Description of the Related Art

Memory for computers or other electronic devices can include blocks of memory cells integrated into a larger integrated circuit or standalone integrated circuits. There are many different types of memory including random-access memory (RAM), read only memory (ROM), dynamic random access memory (DRAM), static RAM (SRAM), synchronous dynamic RAM (SDRAM), flash memory, magnetoresistive random-access memory (MRAM) and phase change memory (PCM). Many semiconductor memory technologies arrange individual memory cells into arrays that may be accessed using bit lines (or column select lines) that connect to columns of memory cells in the array and word lines (or row select lines) that connect to rows of memory cells in the array.

Many types of memory may be accessed by providing a select voltage on the appropriate bit line and/or word line. Some memory technologies, such as resistive cross-point memory technologies including PCM, may use a deselect voltage to be driven on the inactive word lines and/or bit lines to achieve proper biasing during a memory access.

In certain instances, a memory cell may comprise a PCM component (for example, a germanium-antimony-tellurium (GST) component such as an ovonic memory switch (OMS), etc.) and a selection component (for example, a thresholding component such as an ovonic threshold switch (OTS)). Such a memory cell may, for example, be referred to as a PCM and Switch (PCMS) memory cell.

BRIEF DESCRIPTION OF THE DRAWINGS

The drawings and the associated description herein are provided to illustrate specific embodiments of the disclosure and are not intended to be limiting.

FIG. 1C is a chart showing circuit behavior during a SET function when a set current is provided by a selection supply, in accordance with one or more embodiments of the disclosure.

FIG. 1D is a chart showing circuit behavior during a SET function when a set current is provided by a de-selection supply, in accordance with one or more embodiments of the disclosure.

FIG. 3A illustrates an example of a non-transistor de-selection element, in accordance with one or more embodiments of the disclosure.

FIG. 3B illustrates an example implementation of a non-transistor de-selection element, in accordance with one or more embodiments of the disclosure.

FIG. 7 is yet another chart showing circuit behavior during a SET function, in accordance with one or more embodiments of the disclosure.

DETAILED DESCRIPTION OF SPECIFIC EMBODIMENTS

Figure 1A:
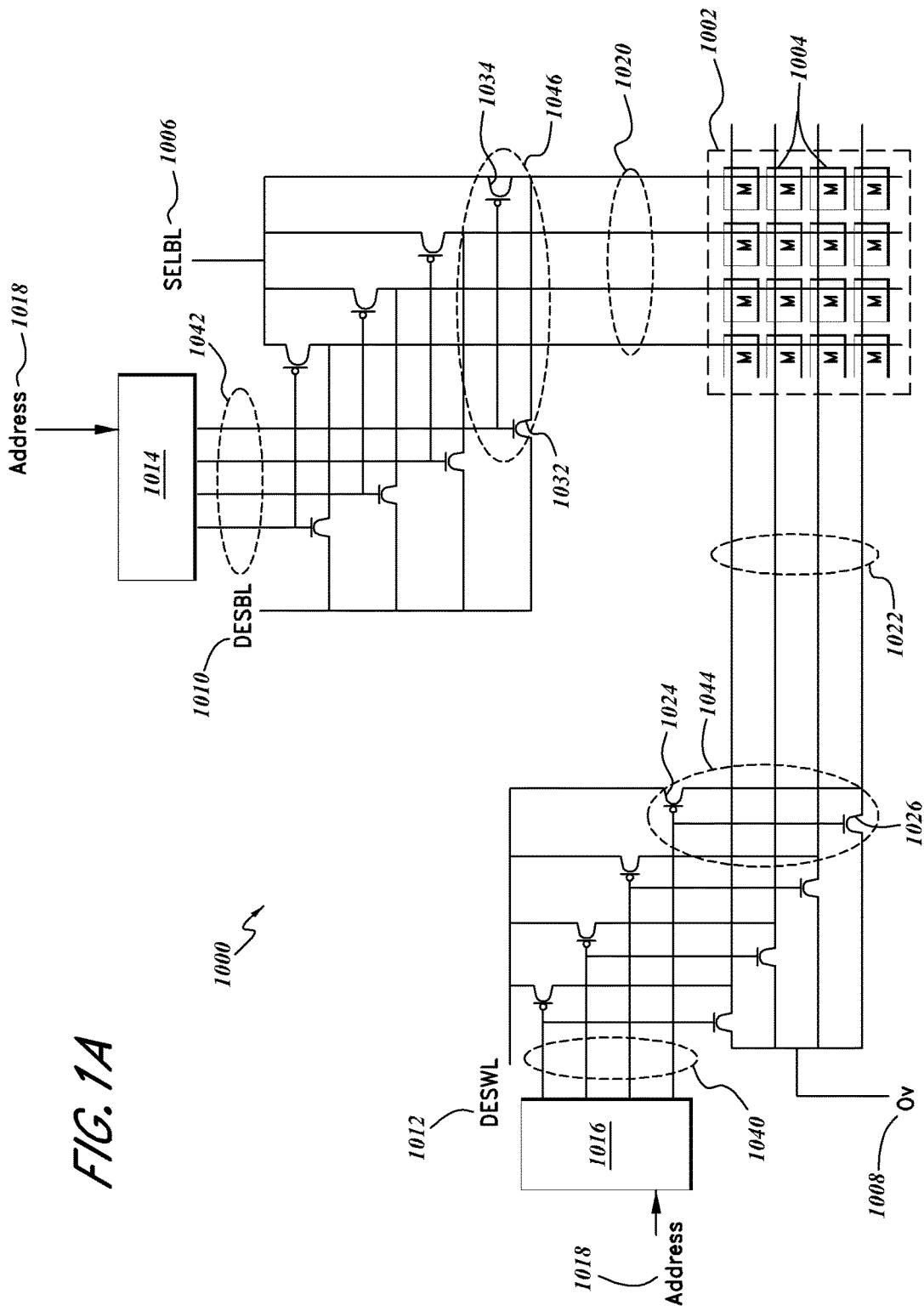
FIG. 1A is a circuit diagram showing a memory array with selection and de-selection elements in accordance with one or more embodiments of the disclosure.

Although particular embodiments are described herein, other embodiments of the invention, including embodiments that do not provide all of the benefits and features set forth herein, will be apparent to those of ordinary skill in the art.

A memory circuit, including a memory array (such as a cross-point array), may include circuit elements that may function both as selection elements/drivers and de-selection elements/drivers. A selection/de-selection driver may be used to provide both a de-selection function, as well as a selection function. The selection function may include providing sufficient currents and voltages for WRITE and/or READ operations in the memory array. The selection function may be accomplished by circuit manipulation of a de-selection supply and/or de-selection elements, as is described in detail below.

In one embodiment, efficient biasing in a memory array (such as a cross-point array) of cells (for example, PCM cells) can use de-selected cells configured with a relatively low amount of electrical potential/voltage across them. This is accomplished by driving the word lines and bit lines associated with the de-selected cells in the array to a "mid-bias" voltage level with respect to the selected potentials/voltages of the memory array/circuit.

One approach to achieving the de-selection of cells, or the de-selection function, is to provide a de-selection driver at each, for example, word line and bit line of the memory array. The de-selection driver may comprise, for example, a transistor, a reduced function transistor, a passive element, and/or an array based element. Alternative approaches also exist whereby the selection function, as well as the de-selection function, is accomplished by the same transistor.

Various embodiments of the present disclosure describe methods and circuit apparatuses including selection/de-selection elements and/or drivers that may provide both the de-selection function and the selection function.

In an embodiment, transistor-based selectors/de-selectors may include full decoding. In this embodiment, a connection to the selector/de-selector is accomplished automatically by applying a selection pulse to the target memory cell, followed quickly by a de-selection transition on one electrode (word line or bit line). When the selection pulse is sufficient to snapback the memory cell (i.e., cause a snapback event), the memory cell remains in the on state (also referred to as the active state or selected state) through the de-selection transition. Alternatively, the memory cell may briefly turn off during the de-selection transition, but may be re-triggered during a recovery period of the cell. For some memory technologies, including phase change materials, the threshold of the memory cell immediately after trigger is reduced and may require a finite period of time before recovering to its initial value. The de-selection transition may comprise supplying voltage and current to the selected cell from a mid-bias (or de-selection) source/supply. Following the de-selection transition, the memory cell may be selected and/or a SET operation may be accomplished (and/or other WRITE and/or READ operations may be accomplished) as a particular (and sufficient) current is supplied to the cell for a particular (and sufficient) period of time. In this embodiment, no additional selection pulse circuitry is needed other than the circuitry necessary to generate the actual selection pulse. In addition, in various embodiments, the mid-bias supply may not be decoded. High efficiency is achieved compared to methods that use the selection path for the SET operations because the mid-bias supply is a lower voltage supply than the selection pulse supply.

In various embodiments, odd/even or other reduced decoding of the de-selection path may be accomplished with any of waffle, passive, and/or array-based devices. In these embodiments there may be a slight delay in enabling the de-selection path due to, for example, circuit mismatches. The de-selection transition may be accomplished as long as the de-selection path is enabled within the recovery period of the memory cell, and the de-selection (mid-bias) supply is capable of supporting the currents necessary for the WRITE and/or READ operation.

In various embodiments, the de-selection (mid-bias) supply may be limited in supply capacity, and may not provide sufficient voltage and/or current to the memory cell for WRITE and/or READ operations. In these embodiments, the mid-bias supply may be partially decoded to enable the memory array to meet WRITE and/or READ operation requirements. A mid-bias supply being partially decoded may, in various embodiments, mean that that one or more mid-bias supplies may be selectively applied to one or more groups of bit lines and/or word lines. For example, in an embodiment, partial decoding of the mid-bias supply may comprise implementing multiple mid-bias supplies so as to increase the current available from each. Further, groups of bit and/or word lines may each be electrically coupled to one of the multiple mid-bias supplies. In an embodiment, the voltage of one or more of the mid-bias (de-selection) supplies may be increased temporarily so as to meet current requirements for WRITE and/or READ operations.

In various embodiments, array-based de-selector elements may be used. In these embodiments, the array-based de-selector elements may have threshold characteristics. Following the de-selection transition, a partially decoded de-selection supply may provide a voltage pulse to one or more of the array-based de-selector elements to trigger the elements into a low-resistance state (due to a snapback event). The low resistance state of the one or more array-based de-selector elements may then provide additional current necessary to support WRITE and/or READ operations in the selected memory cells.

Various embodiments of the present disclosure advantageously use significantly less energy and power because current used during WRITE and/or READ operations is supplied by the mid-bias supply, rather than the much higher voltage selection supply. Additionally, because current is supplied to the memory cell from the selection supply only temporarily, particular elements of the selection circuitry (for example, particular transistors) no longer must supply high current, and may thus be sized smaller than previously. The smaller transistor size may, for example, reduce on-chip area requirements for the memory device. Additionally, because the voltages used during the WRITE and/or READ functions are lower, the transistor critical dimensions such as gate-length and gate oxide thickness may be reduced, further reducing the on-chip area required. Lower voltages may further enable improvements in power, speed, and/or resiliency of the memory device. Potentially damaging electrical fields may also be reduced as a result of the use of lower voltages.

FIG. 1A is a circuit diagram of a memory circuit 1000 with a memory array 1002 and associated select/de-select drivers (for example, select/de-select drivers 1044, 1046). The memory array 1002 may comprise an array of memory cells 1004. Any type of memory technology may be used including, but not limited to, dynamic random access memory (DRAM), flash memory, and phase change memory (PCM), memristor memory, or other types of memory. Although FIG. 1 shows a 4×4 array of 16 memory cells 1004, the memory array 1002 may contain any number of memory cells 1004, and may not have the same number of columns as rows. The memory array 1002 may typically contain at least many millions of memory cells 1004; however, disclosed subject matter is not limited to a particular number. The memory array 1002 may have a number of select lines that may cross the memory array 1002 in two directions. The select lines may be referred to as row select lines, or word lines 1022, and column select lines, or bit lines 1020, although other names may be used. Respective memory cells 1004 in the memory array 1002 may be coupled to one word line 1022 and one bit line 1020. For example, by applying a select voltage on a word line and a select voltage on a bit line, the memory cell 1004 that is coupled to those two lines may be accessed to read or write the memory cell 1004. The exact voltage and timing sequence for the select lines may vary depending on the memory technology used, and some memory technologies may use additional lines to access an individual memory cell 1004 or group of memory cells 1004.

Select/de-select drivers in the memory circuit 1000 may be operable to both select and de-select individual memory cells 1004, as is described in detail below. For clarity purposes, the present disclosure may use the following terms interchangeably, all of which are intended to refer to embodiments of select/de-select drivers: "driver," "select/de-select driver," "select driver," "de-select driver," "selection/de-selection driver," "selection driver," and/or "de-selection driver." Additionally, the terms "driver" and "element" may be used synonymously and interchangeably. Thus, the term "de-selection element," among others, may also be used to refer to embodiments of the select/de-select drivers of the present disclosure.

An address 1018 may be provided by a memory controller (not shown) and received by the memory circuit 1000 and distributed to column circuitry 1014 and row circuitry 1016 to be decoded. Sections of the address 1018 may be decoded in various ways in one or more embodiments. Each of the row circuitry 1016 and column circuitry 1014, as described herein, may be implemented using similar embodiments or using different techniques.

In some embodiments, the row circuitry 1016 and column circuitry 1014 may fully, or nearly fully, decode the address to provide $2^n$ select/de-select control lines 1040, 1042 for n address bits that may be used to control the select/de-select drivers (for example, select/de-select drivers 1044, 1046) so that for each row and column, at least one select/de-select driver is enabled to select a line and the at least one or more other select/de-select drivers enabled to de-select lines. In other embodiments, a section of address may be split into multiple subsections to provide a cascaded decode. As an example, an 8-bit section of address 1018 for use in selecting a particular word line 1022 or bit line 1020 of the 256 word lines or 256 bit lines of the memory array 1002 may be split into two 4-bit subsections. The low order 4 bits may be decoded into 16 select/de-select control lines 1040 or control lines 1042 that drive 16 sets of 16 select/de-select drivers (for example, select/de-select drivers 1044, 1046) so that one or more of the 16 outputs drive 16 select/de-select drivers. The row circuitry 1016 and column circuitry 1014 of FIG. 1A each shows two bits of address decoded into four control lines 1040, 1042, however, in various embodiments larger or smaller decoder circuitry may be implemented for any number of address bits.

In an embodiment, a word line select/de-select driver 1044 may include a p-type field-effect transistor (FET) 1024 and an n-type FET 1026. The field-effect transistors (FETs) or "transistors" described herein can correspond to transistors known as metal-oxide-semiconductor field-effect transistors (MOSFETs). While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics. The gates of the p-type FET 1024 and n-type FET 1026 may be driven by the appropriate control line 1040 output by the row circuitry 1016. The drain of the p-type FET 1024 and the drain of the n-type FET 1026 may be coupled to the appropriate word line 1022. Additionally, the source of the p-type FET 1024 may be coupled to a de-select word line voltage source (DESWL) 1012, also referred to as a mid-bias voltage source, while the source of the n-type FET 1026 may be coupled to a ground 1008 (such as, zero volts) or other voltage reference. Similarly, other word lines 1022 may be coupled to respective select/de-select drivers as shown in FIG. 1A.

Additionally, a bit line select/de-select driver 1046 may include a p-type FET 1034 and an n-type FET 1032. The gates of the p-type FET 1034 and n-type FET 1032 may be driven by the appropriate control line 1042 output by the column circuitry 1014. The drain of the p-type FET 1034 and the drain of the n-type FET 1032 may be coupled to the appropriate bit line 1020. Additionally, the source of the p-type FET 1034 may be coupled to a select bit line (SELBL) voltage source 1006, while the source of the n-type FET 1032 may be coupled to a de-select bit line (DESBL) voltage source 1010, also referred to as a mid-bias voltage source. Similarly, other bit lines 1020 may be coupled to respective select/de-select drivers as shown in FIG. 1A.

The SELBL voltage source 1006 may be referred to as a selection source, a selection supply, a selection pulse source/supply, and/or a high voltage source/supply. Further, the voltage supplied by the SELBL voltage source 1006 may be referred to as a selection voltage and/or a selection potential. In an embodiment, the SELBL voltage source 1006 may supply a voltage of 8 volts. In an embodiment, the mid-bias voltage sources, for example, the DESBL voltage source 1010 and/or the DESWL voltage source 1012, may supply a voltage of 4 volts. Alternative voltage ranges are possible such as (6 v, 3 v, 0 v) or (−5 v, 0 v, 5 v) respectively, as necessary to meet the biasing requirements of the cross-point array of the particular technology. Other voltages may be supplied in the memory circuit 1000, depending on the memory technology of the particular embodiment. In an embodiment, the voltages and currents supplied to the memory circuit 1000 maybe provided by off-chip sources through, for example, pins. Alternatively, the voltages and currents may be provided by on-chip sources.

The select/de-select drivers of the memory circuit 1000 may be constructed using any applicable technology including metal oxide semiconductor field-effect transistors (MOSFET), chalcogenide devices, bipolar junction transistors, or other types of electronic devices. The select/de-select drivers may be designed to handle the voltage and current requirements for selecting a memory cell 1004 or the memory array 1002 which may depend at least in part on the memory technology used.

The operation of the memory circuit 1000 is described below in reference to FIGS. 1B-1D and the remaining figures.

Figure 1B:
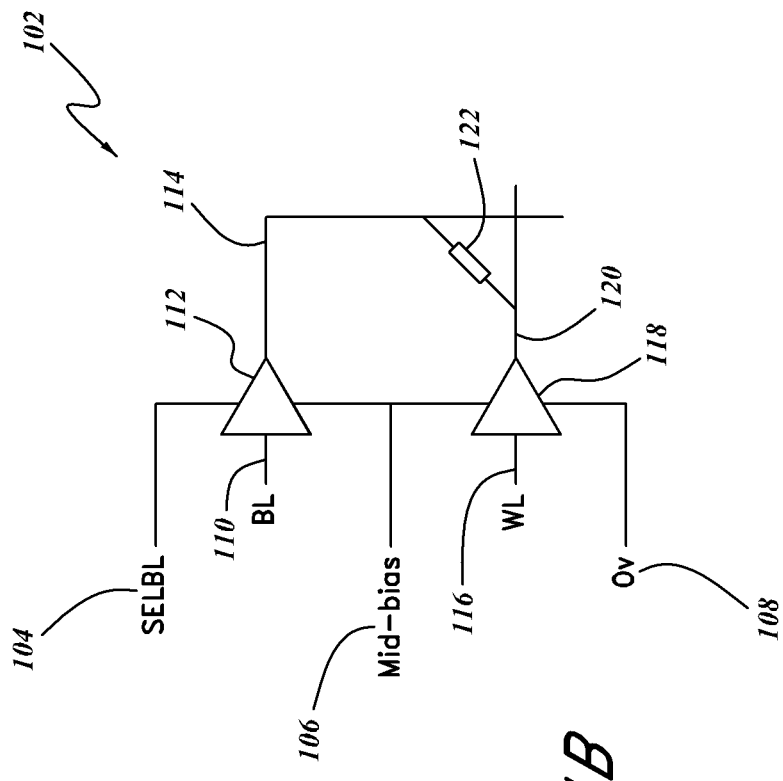
FIG. 1B is a circuit diagram showing a memory cell with array drivers which may include selection and de-selection elements in accordance with one or more embodiments of the disclosure.

FIG. 1B shows a simplified circuit diagram of an illustrative memory cell circuit 102, which includes components that can be shared with other memory cells, such as a driver circuit 112, 118, in accordance with one or more embodiments of the disclosure. For example, the first driver 112 can be shared by a plurality of memory cells of a column of an array, and the second driver 118 can be shared by a plurality of memory cells of a row of the array. In an alternative embodiment, the first driver 112 can be used to drive a row, and the second driver 118 can be used to drive a column. The memory cell circuit 102 of FIG. 1B includes a memory cell 122, which may correspond to any of the memory cells 1004 of FIG. 1A.

The memory cell circuit 102 includes a node 104 for a first voltage reference, a node 106 for a second voltage reference, and a node 108 for a third voltage reference. In the illustrated embodiment, the first voltage reference corresponds to a select bit line (SELBL) voltage source 104, the second voltage reference corresponds to a mid-bias voltage source 106, and the third voltage reference corresponds to ground 108. In the illustrated embodiment, the SELBL voltage is positive and higher than the mid-bias voltage, which is positive and non-zero, and ground is at 0 volts. However, other voltages can be used for the voltage references.

The mid-bias voltage source 106 may correspond to either or both of the DESBL voltage source 1010 and DESWL voltage source 1012 of FIG. 1A. Additionally, the memory cell circuit 102 includes a bit line (BL) select 110 corresponding to, for example, one of the control lines 1042 (FIG. 1A), a word line (WL) select 116 corresponding to, for example, one of the control lines 1040 (FIG. 1A), a first driver 112 corresponding to, for example, the bit line select/de-select driver 1046 (FIG. 1A), a second driver 118 corresponding to, for example, the word line select/de-select driver 1044 (FIG. 1A), a bit line 114, a word line 120, and the memory cell 122.

In an embodiment, for example in PCMS technology, the memory cell 122 may comprise a memory element and a selection component. Such a memory cell 122 may exhibit snapback behavior or have snapback events under certain conditions, and may be referred to as a snapback device. A snapback event may result in a sudden "negative resistance", under certain conditions. An occurrence of a snapback event tends to significantly affect a current-voltage behavior of a memory cell. For example, a snapback event generally drives the device into a high conduction and/or low resistance state. Such a snapback event may be sensed or detected. Thus, in various embodiments, a sense circuit may, for example, be provided which is responsive to a snapback event occurrence in a memory cell to generate one or more feedback signals. By way of example, one or more feedback signals may initiate a change in an electric potential across the memory cell and/or memory element to reduce the electric potential, disconnect the electric potential, stop the generation of the electric potential, etc. Thus, for example, the power consumption of a memory cell may be reduced in response to a snapback event.

In the memory cell circuit 102 of FIG. 1B, the memory cell 122 may be selected and/or de-selected by the first driver 112 and the second driver 118, as is described below. Selection of the memory cell 122 may be accomplished to, for example, establish a programmed state in the memory cell (for example, as part of a WRITE operation). Examples of write operations may include, for example, SET and RESET. Selection of the memory cell 122 may also be accomplished to, for example, determine a programmed state of the memory cell (for example, as part of a READ operation). On the other hand, de-selection of the memory cell 122 may, depending on the memory technology, be accomplished so as to allow selection of other memory cells for WRITE and/or READ operations. The memory cell circuit 102, including the first driver 112 and the second driver 118, enable both selection and de-selection of the memory cell 122 without any additional circuitry. Additionally, as is described below, the arrangement of the memory cell circuit 102 may significantly reduce the power required to perform WRITE and/or READ operations.

FIG. 1C illustrates a set of voltage waveforms showing circuit behavior for a memory cell during a SET function when a set current is provided by a selection supply. FIG. 1C may be contrasted with the voltage waveform of FIG. 1D, which is described in detail below. In particular, the voltage waveform of FIG. 1C shows a typical SET function of the memory cell circuit 102 that may use a significant amount of energy. On the other hand, FIG. 1D shows a SET function of the memory cell circuit 102 (FIG. 1B) that may use significantly less energy by making use of the mid-bias source 106, according to an embodiment of the present disclosure.

FIG. 1C shows four voltage waveforms 150, 152, 154, 156 with voltages varying over time between zero volts and the SELBL voltage, with mid-bias indicating some voltage between the SELBL voltage and zero volts. Typically, the mid-bias voltage is a voltage substantially half-way between SELBL and zero volts. Also shown in FIG. 1C is the state of WL selection 168 (corresponding to WL select 116) and BL selection 170 (corresponding to BL select 110).

In FIG. 1C, a waveform 150 for the voltage of the bit line 114 and a waveform 152 for the voltage of the word line 120 for the selected memory cell are indicated. A waveform 156 for the voltage of a bit line and a waveform 154 for the voltage of a word line for one or more de-selected memory cells are also indicated in FIG. 1C. As shown, the voltages of both the bit and word lines of the de-selected cells (waveforms 154 and 156) are driven to the mid-bias level through the entire time period represented. On the other hand, beginning at a time instant represented by a dashed line 169, when the WL selection 168 goes high and the BL selection 170 goes high, the waveform 150 indicates that the bit line 114 is pulled to the SELBL voltage, while the waveform 152 indicates that the word line 120 is pulled to zero volts. As shown in the time period 158, a snapback event rapidly occurs in the selected memory cell, causing a collapsed voltage.

During a time period 160, the selected memory cell enters a stable state during which the cell may be set. In the example of FIG. 1C, a difference 162 in the voltage of the bit line 114 is indicated corresponding to a difference between when the memory cell is initially selected and after the snapback event occurs. Similarly, a difference 164 in the voltage of the word line 120 is indicated corresponding to a difference between when the memory cell is initially selected and after the snapback event occurs. The voltage differences 162 and 164 represent resistive voltage drops across the array driver transistors and electrodes in the array. During the stable state time period 160, the voltage difference across the memory cell 122 (between the bit line 114 and word line 120) is indicated by a difference 166. The difference 166 also provides an indication of the current flowing from the SELBL voltage source 104 to ground, and the amount of power being used by the memory cell during the SET operation. In an embodiment, the memory cell is set by the application of a particular magnitude of current over a particular period of time. Thus, the memory cell may be set by the current applied to the memory cell 122 during the time period 160. In various other embodiments, the shape of the waveforms during the SET function may be any other shape besides the generally rectangular shape of the waveforms of FIG. 1C during time period 160. For example, the shape of the waveforms may include one or more pulses, and/or may be ramped.

At the end of the SET function, the bit line 114 and word line 120 of selected memory cell settle back to the mid-bias supply voltage.

Turning now to FIG. 1D, as mentioned above, FIG. 1D shows a SET function of the memory cell circuit 102 that may use significantly less energy relative to the function of FIG. 1C by making use of the mid-bias source 106, according to an embodiment of the present disclosure. FIG. 1D again includes waveforms 150, 152, WL selection 168, and other (unlabeled) waveforms representing other de-selected memory cells. FIG. 1D also includes a BL pulse 182. At a time period represented by a dashed line 180, the memory cell 122 is selected as indicated by the activation of the WL selection 168 and the BL pulse 182, at which point the bit line 114 is pulled to the SELBL voltage, and the word line 120 is pulled to about zero volts. During a time period 171, a snapback event quickly occurs, at which point the voltage across the memory cell 122 collapses.

At a time instant represented by a dashed line 172, immediately after the snapback event occurs, the BL select 110 is de-selected, as indicated by the BL pulse 182. The correct timing of the de-selection of the BL select 110 may be determined based on a period of time (for example, a particular period of time after memory cell selection) and/or by detection of the snapback event. De-selection of the BL select 110 biases the bit line 114 to the mid-bias level, rather than to the SELBL voltage, as was the case described earlier in connection with FIG. 1C. For example, de-selection of the BL select 110 creates a de-selection voltage potential, or mid-bias voltage potential, that is, from mid-bias to zero volts), across the memory cell 122. Thus, during the stable time period 174, the memory cell 122 biased between the mid-bias supply and ground, rather than between the SELBL voltage and ground as described earlier in connection with FIG. 1C, thereby saving power. Additionally, the snapback effect remains in effect, causing a further voltage drop of the bit line 114 and word line 120, indicated by a difference 175 (the difference in voltage between the mid-bias and the bit line 114), a difference 178 (the voltage difference across the memory cell 122), and a difference 176 (the difference in voltage between the word line 120 and ground). It should be noted that the differences 175 and 176 are substantially reduced from the equivalent differences 162 and 164, while the difference 178 (the voltage across the cell) is the same as the difference 166.

As described in reference to FIG. 1C, during the time period 174 the memory cell is set by the current flowing through the memory cell 122. At the end of the SET function, the bit line 114 and word line 120 of selected memory cell settle back to the mid-bias supply voltage.

In an embodiment, the time period 160 and/or time period 174 comprises a duration of on the order of hundreds of nanoseconds. In an embodiment, the current flowing through the memory element during the WRITE operation may be on the order of tens of micro amps.

In various embodiments, the memory device is designed such that the voltage difference 178 is sufficient to support the current that should flow through the memory cell to set the cell, taking into account any additional resistive paths (and/or leakage current). Alternatively, additional mid-bias supplies (for example, multiple DESBL voltage sources 1010 and/or DESWL sources 1012) may be provided to support current requirements (as described in reference to FIGS. 5A and 5B below).

In various embodiments, the operation described in reference to FIG. 1D may be adapted to other WRITE and READ operations of the memory device. For example, the operation of FIG. 1D may be used in a RESET operation. In addition, the same operations can be extended to memory technologies that may require a polarity reversal of electrodes across the cell for the some cell operations.

The operation of the memory cell as shown in FIG. 1D enables multiple advantages over the operation shown in FIG. 1C. In particular, the operation of FIG. 1D uses significantly less energy and power as the current used to set the memory cell is supplied by the mid-bias supply, rather than the much higher SELBL supply. Additionally, because the current is supplied to the memory cell from the SELBL supply only temporarily, the p-type FET 1034 (FIG. 1A) can be sized smaller than previously. The smaller transistor size may, for example, reduce on-chip area requirements for the memory device saving manufacturing cost. Additionally, because the voltages used during the WRITE and/or READ functions are lower, transistor features such as gate-length and gate-oxide thickness may be reduced, further reducing the on-chip area required. Lower voltages may further enable improvements in power, speed, and/or resiliency of the memory device. Potentially damaging electrical fields may also be reduced as a result of the use of lower voltages.

The techniques described herein may variously be applied to all types of cross point memories, including resistive memory arrays. In contrast to typical selection and de-selection techniques, in various embodiments the techniques of the present disclosure utilize combined selection/de-selection drivers/elements to both select particular cells, and de-select other cells. These techniques enable many of the advantages mentioned above, and further described below.

Figure 2B:
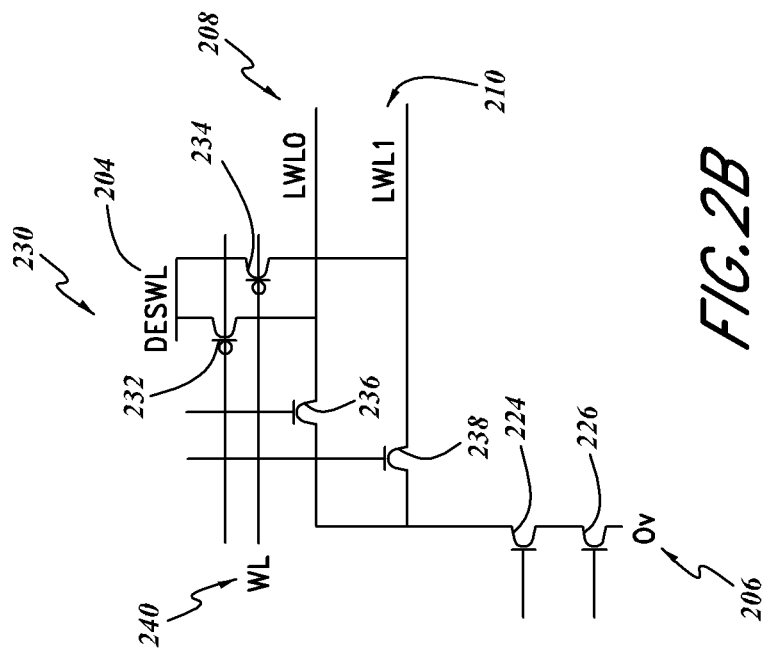
FIG. 2B illustrates an example of an array driver with partially decoded de-selection elements, in accordance with one or more embodiments of the disclosure.
Figure 2A:
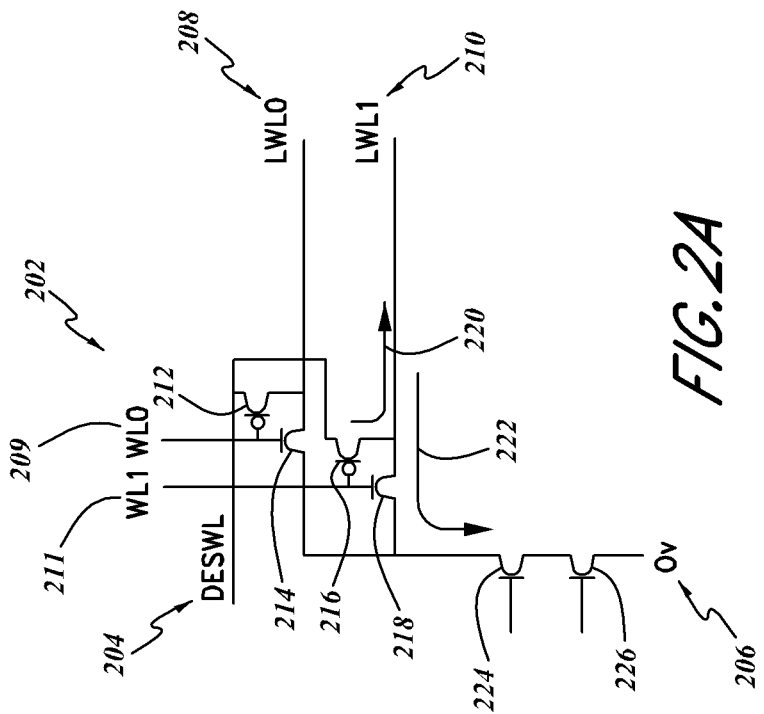
FIG. 2A illustrates an example of an array driver with a fully decoded de-selection element, in accordance with one or more embodiments of the disclosure.

FIG. 2A illustrates an example of an array driver with a fully decoded selection/de-selection driver/element 202, in accordance with one or more embodiments of the disclosure. The driver of FIG. 2A is designed for driving word lines (similar to the word line select/de-select driver 1044 of FIG. 1A), however a similar driver may be implemented for driving bit lines.

In FIG. 2A, the driver 202 is fully decoded, meaning that each word line may be separately selected/de-selected. FIG. 2A illustrates a DESWL source 204 and a zero volt reference (or ground) 206 that are not part of the driver 202. The driver 202 includes a first local word line (LWL0) 208, a second local word line (LWL1) 210, a first word control line (WL0) 209, a second word control line (WL1) 211, p-type FETs 212, 216, and n-type FETs 214, 218, 224, 226. The DESWL source 204 (as generally described in reference to DESWL 1012 of FIG. 1A) provides a mid-bias voltage source to the driver 202. Control signals for the WL0 209 and WL1 211 can be provided by a memory controller (not shown). The LWL0 208 and the LWL1 210 are generally coupled to many memory cells. The WL0 209 and the WL1 211 are coupled to control circuitry which provides control signals to the driver 202. The N-type FET 224 and the n-type FET 226 may be used in some embodiments for additional decoding and/or control.

In operation, when at least one of the WL0 209 and/or the WL1 211 is de-selected or "low" in this example, the LWL0 208 and/or the LWL1 210 is pulled to the level of the DESWL source 204 (mid-bias), respectively. This is indicated by the arrow 220 which indicates the de-selection current path. Alternatively, when the WL0 209 and/or the WL1 211 is selected or "high" in this example, the LWL0 208 and/or the LWL1 210 is pulled to the level of ground, respectively. This is indicated by the arrow 222 which indicates the selection current path.

FIG. 2B illustrates an example of an array driver with partially decoding (or partially decoded) de-selection driver 230, in accordance with one or more embodiments of the disclosure. The illustrated embodiment of the driver of FIG. 2B is intended to drive word lines;

however, a similar driver may be implemented for driving bit lines. Many of the same elements are from FIG. 2A are included in FIG. 2B, and thus only differences between the two figures are described.

The driver 230 is partially decoding, meaning that groups of word lines may be simultaneously de-selected (connected to the DESWL supply), while specific word lines may be selected as before. For example, in one arrangement, a single word control line may de-select many even and/or odd local word lines. As shown, driver 230, a single word control line (WL) 240 coupled to p-type FET 234 may also be coupled to one or more other p-type FETs. Similarly, a single word control line coupled to p-type FET 232 may also be coupled to one or more other p-type FETs. Thus, a signal provided by a memory controller and carried by the single word control line (WL) 240 may de-select LWL1 210 and one or more other local word lines, while separate signals coupled to n type FET 236 and 238 may individually select the same local word lines.

FIG. 3A illustrates an example of a non-transistor (such as, passive element) selection/de-selection driver/element 300, in accordance with one or more embodiments of the disclosure. The illustrated embodiment of the driver of FIG. 3A is intended to drive word lines; however, a similar driver may be implemented for driving bit lines. Many of the same elements from FIG. 2B are included in FIG. 3A, and thus only differences between the two figures are described.

In contrast with the drivers 202, 230, the driver 300 includes passive elements. Thus, the driver 300 includes passive elements 302, which couple the DESWL source 204 to the LWL0 208 and the LWL1 210. Passive elements 302 may include, in various embodiments, resistors and/or diodes, among other elements. In operation, when one of the first word control line (WL0) 304 or the second word control line (WL1) 306 is de-selected, the LWL0 208 or the LWL1 210, respectively, is pulled to the DESWL voltage. Control signals applied to the WL0 304 and the WL1 306 can be provided by a memory controller. When either of the WL0 304 and/or the WL1 306 is selected, the LWL0 208 and/or the LWL1 210 are pulled to ground, respectively.

FIG. 3B illustrates an example implementation of a non-transistor de-selection element layout 330, as may be used in the driver 300 of FIG. 3A, in accordance with one or more embodiments of the disclosure. In the layout 330, each of contacts 334 may be coupled to a word and/or bit line (for example, LWL0 208 and/or LWL1 210), while each of the contacts 332 may be coupled to a voltage source (for example, DESWL 204). The area between each of contacts 332, 334 may comprise a resistive material. Thus, layout 330 comprises as distributed resistance between the voltage source and each local word line. In various embodiments, other arrangements may be used to implement the driver 300.

Figure 3C:
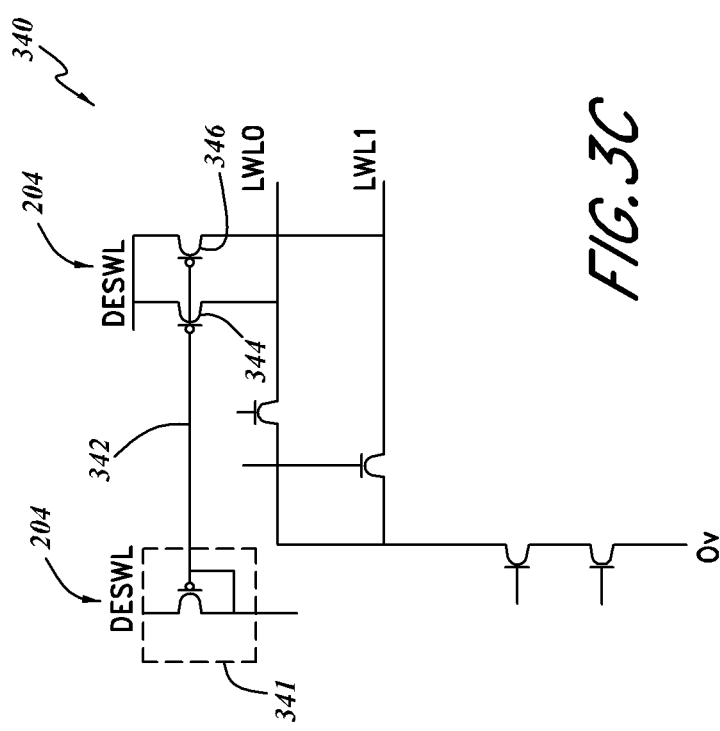
FIG. 3C illustrates an example of a non-decoded de-selection element, in accordance with one or more embodiments of the disclosure.

FIG. 3C illustrates an example of a non-decoded, transistor-based de-selection driver/element 340, in accordance with one or more embodiments of the disclosure. The driver of FIG. 3C is designed for driving word lines, however a similar driver may be implemented for driving bit lines. Many of the same elements from FIG. 3A are included in FIG. 3C, and thus only differences between the two figures are described.

In contrast to drivers 202, 230, driver 340's de-selection path is non-decoded. Thus, driver 340 does not enable selective de-selection of various local word lines. The driver 340 includes a current mirror comprising p-type FETs 341, 344, 346, and line 342. The current minor is coupled to each of the local word lines to provide current when those local word lines are de-selected or selected.

Figure 4:
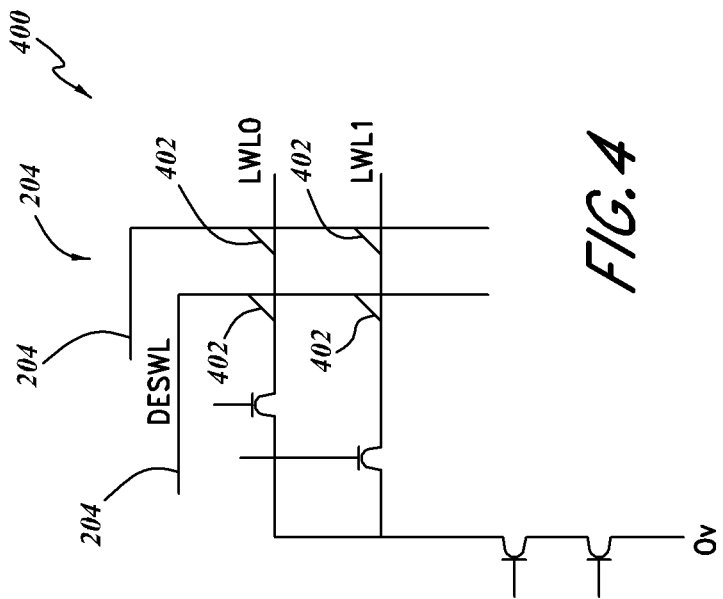
FIG. 4 illustrates an example of an array-based de-selection element, in accordance with one or more embodiments of the disclosure.

FIG. 4 illustrates an example of an array-based de-selection driver/element 400, in accordance with one or more embodiments of the disclosure. The driver of FIG. 4 is designed for driving word lines, however a similar driver may be implemented for driving bit lines. Many of the same elements from FIG. 3A are included in FIG. 4, and thus only differences between the two figures are described.

Similar to driver 340 of FIG. 3C, driver 400's de-selection path is non-decoded. Driver 400 includes DESWL voltage sources 204 coupled to local word lines through array elements 402. In an embodiment, array elements 402 may comprise modified memory elements. Modified memory elements may include modifications that are specific to a technology, and may include, for example, using larger dimensions than normal memory elements, multiple memory elements connected in parallel, and/or memory elements with modified switch components. In addition, the modified memory elements may retain the snapback characteristic of the main memory elements.

In various embodiments, although the drivers 300, 340, and 400 of FIGS. 3A, 3C, and 4, do not include a decoded de-selection part, these drivers may be part of a larger arrangement of drivers that enable global-level and/or patch-level decoding of de-selection paths/supplies.

Figure 5A:
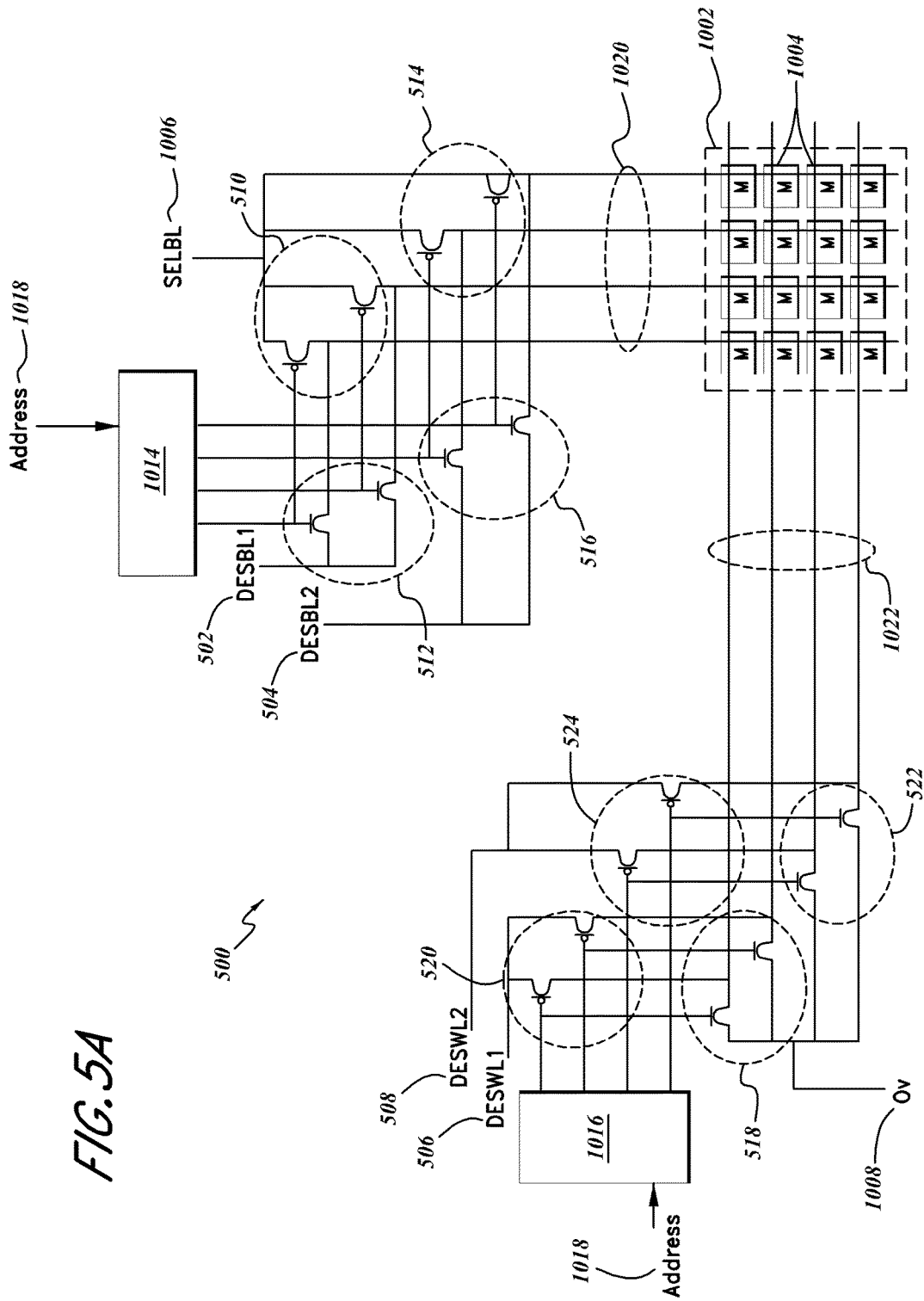
FIGS. 5A-5B are a circuit diagrams showing a memory arrays with de-selection elements including multiple de-selection supplies, in accordance with one or more embodiments of the disclosure.
Figure 5B:
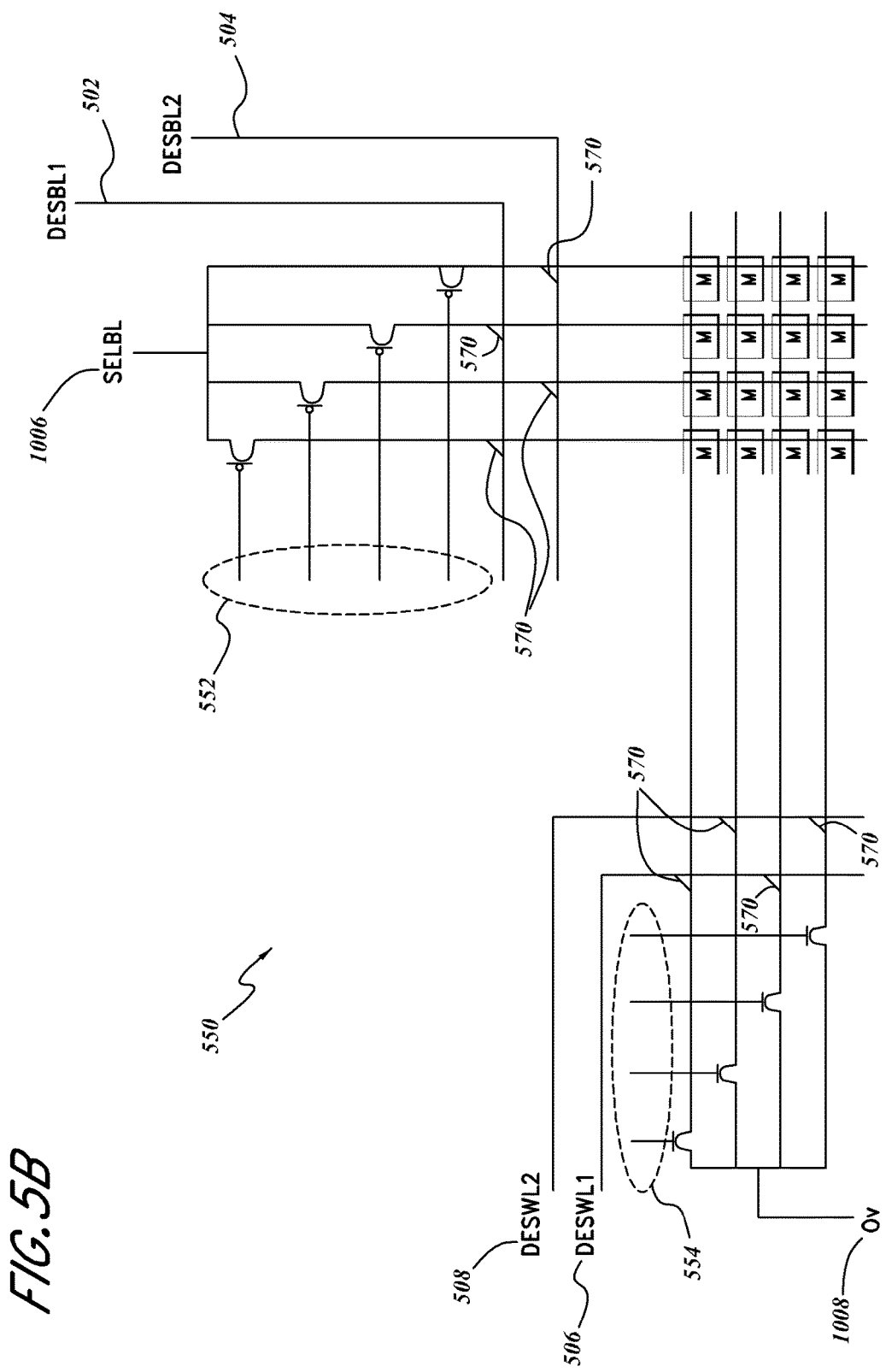

FIGS. 5A-5B are a circuit diagrams showing a memory circuits with fully decoded and partially-decoded de-selection elements respectively including multiple de-selection current/voltage supplies, in accordance with one or more embodiments of the disclosure. As mentioned above in reference to FIG. 1D, in various embodiments sufficient current may be needed during the stable time of the SET operation. This is particularly true because the set current may be supplied by the mid-bias supply to save power. Thus, in various embodiments, multiple mid-bias current sources may be provided, as shown in FIGS. 5A and 5B, to enable various WRITE and READ operation of the memory circuits at lower voltages.

FIG. 5A includes many elements similar to those FIG. 1A described above, thus only the differences are described here. FIG. 5A shows a memory circuit 500 that includes two each of de-select bit line voltage sources (DESBL1 502 and DESBL2 504) and de-select word line voltage sources (DESWL1 506 and DESWL2 508). In the memory circuit 500, the DESBL1 voltage source 502 provides voltage to the drivers comprising n-type FETs 512 and p-type FETs 510, the DESBL2 voltage source 504 provides voltage to the drivers comprising n-type FETs 516 and p-type FETs 514, the DESWL1 voltage source 506 provides voltage to the drivers comprising p-type FETs 520 and n-type FETs 518, and the DESWL2 voltage source 508 provides voltage to the drivers comprising p-type FETs 524 and n-type FETs 522. Multiple current sources/voltage sources thus provide additional current to enable memory cell operations at lower voltages.

FIG. 5B includes many elements similar to those FIGS. 1A and 5A described above, thus only the differences are described here. FIG. 5B shows a memory circuit 550 including array-based de-selection paths. The DESBL1 voltage source 502, the DESBL2 voltage source 504, the DESWL1 voltage source 506, and the DESWL2 voltage source 508 are each coupled to multiple bit and word lines through array elements 570 (similar to those described above in reference to FIG. 4). Further, bit control lines 552 and word control lines 554 may be coupled to, for example, control circuitry. As in memory circuit 500, memory circuit 550 includes multiple current sources/voltage sources to provide additional current to enable memory cell operations at lower voltages. The memory circuit 550 further illustrates a circuit configuration including array based, non-decoded de-selection paths. In an embodiment, a pattern of array based de-selection elements may be desired to enable decoding for odd-even or other such combinations. Multiple voltage/current supplies may reduce overall power because only some of the bit lines and/or word lines will need to transition to the higher levels needed to support the required currents during WRITE and READ operations.

Figure 6:
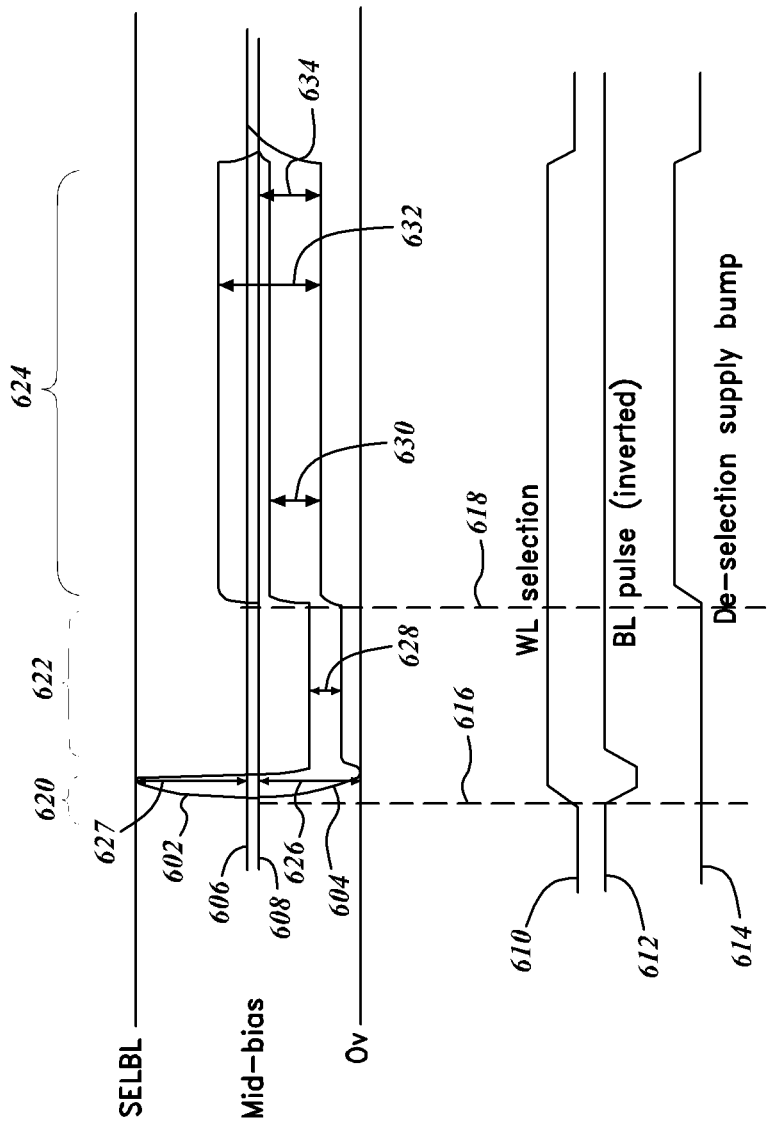
FIG. 6 is another chart showing circuit behavior during a SET function, in accordance with one or more embodiments of the disclosure.

FIG. 6 is chart showing circuit behavior in the memory cell circuit 102 (of FIG. 1B) during a SET function, in accordance with one or more embodiments of the disclosure. The waveform of FIG. 6 is similar to the voltage waveform of FIG. 1D. FIG. 6 illustrates four voltage waveforms 602, 604, 606, 608 with voltages varying over time between zero volts and the SELBL voltage, with the mid-bias voltage corresponding to some voltage between the SELBL voltage and zero volts. Typically, the mid-bias is a voltage about half-way between SELBL and zero volts. Also shown in FIG. 6 is the state of the WL selection 610 (corresponding to WL select 116), the BL pulse 612 (corresponding to BL select 110, but inverted for clarity), and the de-selection supply bump 614. A memory controller can provide control signals for the WL selection 610 and the BL pulse 612.

In FIG. 6, voltages for the bit line 114 and the word line 120 for the selected memory cell are indicated by waveforms 602, 604, respectively. Voltages for the bit line 114 and the word line 120 for one or more de-selected memory cells are indicated by waveforms 608, 606, respectively. As shown, the voltages of both the bit and word lines of most of the de-selected cells (waveforms 608, 606) are driven to mid-bias through the entire time period represented. During a time period 624, however, some de-selected bit lines' voltages are increased, as is described below. On the other hand, beginning at a time instant represented by a dashed line 616, and during the time period 620, when WL selection 610 goes high and BL pulse 612 goes low, the waveform 602 illustrates that the bit line 114 is pulled to the SELBL voltage source, while the waveform 604 illustrates that the word line 120 is pulled to about zero volts. At the time of selection, a voltage difference 626 exists between a voltage of the word line 120 (of the selected memory cell) and the voltage of the word lines and bit lines of the de-selected memory cells. Similarly, voltage difference 627 exists between the voltage of the selected bit line and the deselected word lines and bit lines. The differences 626 and 627 are chosen to support proper biasing of the cross-point array such that false selection of non-target cells and proper selection of the target cell can be achieved during array operation. As shown in the time period 620, a snapback event rapidly occurs in the selected memory cell, causing a collapsed voltage.

Similar to the waveforms of FIG. 1D, during time period 620 the selected memory element exhibits a snapback event, driving the cell into a high conduction, low resistance state. Immediately following the snapback event, the bit line 114 is de-selected, as indicated by the BL pulse 612, and similar to FIG. 1D. For example, de-selection of the BL pulse 612 creates a de-selection voltage potential, or mid-bias voltage potential (i.e., from mid-bias to zero volts), across the memory cell 122. During the time period 622, the selected memory cell enters a stable state during which, in some embodiments, the cell may be set. However, in various embodiments, the voltage difference (indicated by 628) across the memory cell 122 may not be sufficient to provide the necessary current to set the memory cell. For example, in an embodiment the current supply to the memory cells may be limited. To compensate, at a time instant 618, the mid-bias voltage for a portion of the bit line drivers may be temporarily increased, as indicated by the de-selection supply bump 614. During the time period 624, the set current provided to the selected memory cell is increased as indicated by a voltage difference 630. As a consequence, as indicated by voltage difference 632, for a subset of the memory array, a greater voltage difference is created between the target word line and the deselected bit lines and word lines in the array than during time period 622. As this voltage difference 632 is substantially the same as the difference 626 during time period 620, the proper biasing of the cross-point array can be maintained during the SET operation. Examination of the different biases elsewhere within the cross-point array will show that none of the conditions for biasing have been violated. Thus, for cases for which the supply of current is limited, partially decoding the supply to increase voltage levels for particular memory cells may enable the array to meet write requirements.

In an embodiment, the increase in the mid-bias does not necessarily violate biasing constraints after selection, because only one word-line is assumed selected in a cross-point tile and no bit lines are selected. For example, deselecting the target bit line to the mid bias supply after the initial trigger of the target cell allows the mid bias to be increased without incurring a biasing violation elsewhere in the array. In an embodiment, the increase in the mid-bias supply or supplies is enabled only if the snapback event has been detected. Alternatively, the mid-bias/de-selection supply increase may occur after a timed event. The magnitude of the increase may be limited by the biasing constraint of the array. The increase in the mid-bias may be limited to only a subset of bit line drivers.

FIG. 7 is a chart showing circuit behavior in an array-based memory cell during a SET function, in accordance with one or more embodiments of the disclosure. For example, the voltage waveform of FIG. 7 may be generated by the array-based memory circuit 550 of FIG. 5B. FIG. 7 includes four voltage waveforms (702, 704, 706, and 708) with voltages varying over time between zero volts and SELBL, with mid-bias indicating some voltage between the SELBL voltage and zero volts. Typically, mid-bias is a voltage about half-way between the SELBL voltage and zero volts. Also shown in FIG. 7 is the state of WL selection 710, BL pulse 712 (inverted), and de-selection element trigger pulse 714. A memory controller can provide the control signals for the WL selection 710, the BL pulse 712, and the de-selection element trigger pulse 714.

In FIG. 7, the bit line and word line levels for the selected array-based memory cell are indicated by waveforms 702, 704, respectively. Bit line and word line levels for one or more de-selected array-based memory cells are indicated by waveforms 708, 706, respectively. As shown, the voltage levels of both the bit and word lines of the de-selected cells (waveforms 708, 706) are driven to mid-bias through the entire time period represented. On the other hand, beginning at time instant 716 (represented by a dashed line), and during the time period 720, when WL selection 710 goes high and BL pulse 712 goes low, the waveform 702 indicates that the bit line is pulled to the SELBL voltage, while the waveform 704 illustrates that the word line is pulled to zero volts. During the time period 720 the selected memory element exhibits a snapback event, driving the cell into a high conduction, low resistance state.

Then, during time period 722, the selected memory cell enters a stable state during which, in some embodiments, the cell may be set. However, in various embodiments, the voltage difference (indicated by 726) across the memory element may not be sufficient to provide the necessary current to set the memory cell. To compensate, during time period 715 the snapback event is detected, and as a result at time period 718 (indicated by a dashed line) a de-selection element trigger pulse 714 is applied to the selected cell. The de-selection element trigger pulse 714 comprises a temporary bump in the mid-bias supply voltage to the de-selection array element associated with the bit line of the selected cell (for example, the particular array element 570, as shown in FIG. 5B) or to a group of such bit-lines associated with the selected cell. The snapback event may be detected by, for example, lower resistance and/or high current flow in the selected cell. In an embodiment, the trigger pulse 714 is only applied after the snapback event has been detected. Because the bit line voltage (waveform 702) is already low, the pulse applied to the mid-bias supply of the particular bit line de-selection element may trigger a snapback event for that particular de-selection element, forcing the element into a high conduction state. This enables additional current capacity to the target selected cell during the time period 724, as indicated by the increased voltage difference 728. The memory cell may therefore have sufficient current to accomplish the SET operation (or other operation) during the time period 724.

In an embodiment, the mid-bias supply may be pulsed on one or more bit line de-selection elements depending on the decoding configuration of the memory circuit.

Thus, as shown in FIG. 7, for the embodiment including array-based de-selector elements with threshold characteristics, a partially decoded supply may be pulsed to trigger the de-selector element into a low resistance state, which may then improve a loadline supply (current supply) to the selected memory cell.

In an embodiment, the WRITE operation techniques described in the present disclosure may be particularly applicable to READ operations when the READ operations use fixed current and/or require a stable current for a particular period of time.

In various embodiments and various memory technologies, when a memory cell is selected there is a particular minimum current required to maintain the selected cell in a conducting, low resistance, state (an "on state"). While the techniques described herein maintain the selected memory cells in the on state, various embodiments may additionally employ other techniques. For example, in an embodiment a current control circuit may be applied in order to maintain enough current to maintain an "on state" in a selected cell. Various memory technologies, including phase change materials, have a "recovery period" or "threshold recovery effect." In these memory technologies, the threshold of the memory cell immediately after trigger is reduced and may require a finite period of time before recovering to its initial value. Thus, in these technologies the threshold of the memory cell soon after a snapback event may be very low. For example, when a particular cell requires eight volts to snap back, if that cell drops out of conduction but a voltage is reapplied very quickly, the threshold may be one or two volts. Thus, in some embodiments, when a reduced voltage is applied to a selected memory cell within a short period of time, the selection of the cell may be re-obtained.

One embodiment includes a processor configured to host one or more applications and to initiate write and/or read commands to a memory device controller to provide access to a memory array.

One embodiment includes an apparatus comprising: a memory cell electrically coupled to a first line and to a second line; and a driver circuit electrically coupled to the first line and to the second line, the driver circuit configured: to provide both a selection mode of operation and a de-selection mode of operation for the memory cell; to receive at least a first voltage reference, a second voltage reference, and a third voltage reference, wherein each of the first voltage reference, the second voltage reference, and the third voltage reference is different from one another; to bias the memory cell based on the first voltage reference and the third voltage reference when in the selection mode of operation; and to bias the memory cell based on at least the second voltage reference when in the de-selection mode of operation.

One embodiment includes an electronically implemented method of selecting a memory cell, the method comprising: receiving at least a first voltage reference, a second voltage reference, and a third voltage reference, wherein each of the first voltage reference, the second voltage reference, and the third voltage reference is different from one another; biasing a memory cell with a selection voltage based on the first voltage reference and the third voltage reference to select the memory cell; and biasing the memory cell with a de selection voltage based on at least the second voltage reference to de select the memory cell.

One embodiment includes a system comprising: a processor configured to issue at least one of a read operation or a write operation; a memory device comprising: a memory array comprising a memory cell electrically coupled to a first line and to a second line; and a driver circuit electrically coupled to the first line and to the second line, the driver circuit configured: to provide both a selection mode of operation and a de selection mode of operation for the memory cell; to receive at least a first voltage reference, a second voltage reference, and a third voltage reference, wherein each of the first voltage reference, the second voltage reference, and the third voltage reference is different from one another; to bias the memory cell based on the first voltage reference and the third voltage reference when in the selection mode of operation; and to bias the memory cell based on at least the second voltage reference when in the de selection mode of operation; and a bus configured to carry information associated with the at least one of the read operation or the write operation.

Semiconductor memory devices are ubiquitous in apparatuses such as digital electronics devices and various systems (as used herein, an "apparatus" can interchangeably refer to, for example, circuitry, a memory device or combination of memory devices, an electronic device or combination of electronic devices, or a system or combination of systems). These various systems can include a process configured to execute instructions and/or access data stored on the memory devices. Examples of apparatuses include, but are not limited to, desktop computers, workstations, servers, tablets, laptop computers, digital cameras, video cameras, digital media players, personal digital assistants, smart phones, mobile phones, navigation devices, non-volatile storage products, kiosks, automotive products, and the like.

The foregoing description and claims may refer to elements or features as being "connected" or "coupled" together. As used herein, unless expressly stated to the contrary, "connected" means that one element/feature is directly or indirectly connected to another element/feature, and not necessarily mechanically Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

As used herein, a "node" refers to any internal or external reference point, connection point, junction, signal line, conductive element, or the like at which a given signal, logic level, voltage, data pattern, current, or quantity is present.

Various embodiments have been described above. Although described with reference to these specific embodiments, the descriptions are intended to be illustrative and are not intended to be limiting. Various modifications and applications may occur to those skilled in the art.

What is claimed is:

1. A method, comprising:
   initializing a memory cell coupled with a first select line and a second select line, wherein the initializing comprises coupling the first select line with a first voltage source;
   detecting a transition of the memory cell from a first state to a second state that has a lower resistance than the first state; and
   selecting the memory cell based at least in part on detecting the transition, wherein the selecting comprises coupling the first select line with a second voltage source that is different from the first voltage source.

2. The method of claim 1, wherein the second voltage source has a lower voltage magnitude than the first voltage source.

3. The method of claim 1, wherein the second select line is coupled with a third voltage source during the initializing and during the selecting.

4. The method of claim 3, wherein the second voltage source has a voltage that is between a voltage of the first voltage source and a voltage of the third voltage source.

5. The method of claim 3 further comprising:
   deselecting the memory cell by coupling the second select line with a fourth voltage source that is different from the third voltage source.

6. The method of claim 5, wherein the fourth voltage source has a voltage that is between a voltage of the first voltage source and a voltage of the third voltage source.

7. The method of claim 5, wherein the second voltage source and the fourth voltage source are the same voltage source.

8. The method of claim 1, wherein the selecting is performed within a recovery period of the memory cell after detecting the transition.

9. The method of claim 1, further comprising:
   performing an access operation on the memory cell based at least in part on a current associated with the initializing.

10. The method of claim 1, further comprising:
    determining whether the initializing performs an access operation on the memory cell; and
    performing, based at least in part on the determination, the access operation on the memory cell by increasing a voltage magnitude of the second voltage source.

11. An apparatus, comprising:
    a memory array comprising a plurality of memory cells, each of the plurality of memory cells having a first portion electrically coupled with a line of a first plurality of lines and having a second portion electrically coupled with a line of a second plurality of lines; and
    a driver circuit configured to:
    initialize a first memory cell of the plurality of memory cells, wherein the initializing comprises coupling a respective line of the first plurality of lines for the first memory cell with a first voltage source;
    detect a transition of the first memory cell from a first state to a second state that has a lower resistance than the first state; and
    select the first memory cell based at least in part on detecting the transition, wherein the selecting comprises coupling the respective line of the first plurality of lines for the first memory cell with a second voltage source that is different from the first voltage source.

12. The apparatus of claim 11, wherein the second voltage source has a lower voltage magnitude than the first voltage source.

13. The apparatus of claim 11, wherein the driver circuit is configured to couple a respective line of the second plurality of lines for the first memory cell with a third voltage source during the initializing and during the selecting.

14. The apparatus of claim 13, wherein the second voltage source has a voltage that is between a voltage of the first voltage source and a voltage of the third voltage source.

15. The apparatus of claim 14, wherein the driver circuit is configured to:
    deselect the first memory cell, wherein the deselecting comprises coupling the respective line of the second plurality of lines with a fourth voltage source that is different from the third voltage source.

16. The apparatus of claim 15, wherein the second voltage source and the fourth voltage source are the same voltage source.

17. The apparatus of claim 11, wherein the driver circuit is configured to:
    deselect a second memory cell of the plurality of memory cells during the initializing and during the selecting, wherein deselecting the second memory cell comprises coupling a respective line of the first plurality of lines for the second memory cell with the second voltage source.

18. An apparatus, comprising:
    a memory cell, coupled with a first select line and a second select line; and
    a driver circuit configured to:
    initialize the memory cell, wherein the initializing comprises coupling the first select line with a first voltage source;
    detect a transition of the memory cell from a first state to a second state that has a lower resistance than the first state; and
    select the memory cell based at least in part on detecting the transition, wherein the selecting comprises coupling the first select line with a second voltage source that is different from the first voltage source.

19. The apparatus of claim 18, wherein the second voltage source has a lower voltage magnitude than the first voltage source.

20. The apparatus of claim 18, wherein the driver circuit is configured to couple the second select line with a third voltage source during the initializing and during the selecting.

* * * * *